(12) United States Patent
Chen

(10) Patent No.: US 7,381,596 B2
(45) Date of Patent: Jun. 3, 2008

(54) METHOD OF MANUFACTURING AN AMOLED

(75) Inventor: Chen-Ming Chen, Tai-Chung (TW)

(73) Assignee: Chunghwa Picture Tubes, Ltd., Taipei (TW)

(*) Notice: Subject to any disclaimer, the term of this patent is extended or adjusted under 35 U.S.C. 154(b) by 35 days.

(21) Appl. No.: 11/162,832

(22) Filed: Sep. 26, 2005

(65) Prior Publication Data

US 2007/0072348 A1 Mar. 29, 2007

(51) Int. Cl.
*H01L 21/00* (2006.01)
(52) U.S. Cl. .................... 438/149; 438/82; 438/99; 438/151; 257/E21.561
(58) Field of Classification Search ............. 438/149, 438/151, 82, 99; 257/E21.561
See application file for complete search history.

(56) References Cited

U.S. PATENT DOCUMENTS

2001/0055828 A1* 12/2001 Kaneko et al. ............... 438/34
2003/0127650 A1   7/2003 Park
2004/0079945 A1*  4/2004 Weaver et al. ............... 257/71
2004/0191566 A1*  9/2004 Kikuchi et al. .............. 428/690
2004/0235224 A1  11/2004 Lin
2006/0001091 A1   1/2006 Kim
2006/0043373 A1   3/2006 Wu et al.
2006/0146217 A1   7/2006 Ahn
2007/0029545 A1*  2/2007 Striakhilev et al. .......... 257/40

FOREIGN PATENT DOCUMENTS

TW           1238020           8/2005

* cited by examiner

*Primary Examiner*—Michael S. Lebentritt
*Assistant Examiner*—Stanetta D Isaac
(74) *Attorney, Agent, or Firm*—Winston Hsu

(57) ABSTRACT

The present invention relating to a method of manufacturing an AMOLED panel. The method comprises providing a substrate, forming a TFT on the substrate, forming an inter-layer insulator layer, forming a plurality of via holes, forming a metal layer which electrically contacts a source and a drain, forming a transparent electrode, a pixel define layer and a LED. Because the present invention omits a passivation layer, the cost decreases and the process is simpler.

23 Claims, 7 Drawing Sheets

METHOD OF MANUFACTURING AN AMOLED

BACKGROUND OF THE INVENTION

1. Field of the Invention

A method of manufacturing a TFT panel, and more particularly, to a method of manufacturing a LTPS TFT OLED panel.

2. Description of the Prior Art

In general, low temperature poly crystalline silicon thin film transistor (LTPS TFT) array manufacturing needs about six to nine photo-masks to process a photolithograph etching process, which is more complex than five photo-masks required to manufacture the hydrogenated amorphous silicon thin film transistor ($\alpha$-Si:H TFT). In addition, the active matrix organic light-emitting diode (AMOLED) needs seven to ten photo-masks, because of the need to manufacture an LTPS TFT array and a pixel define layer (PDL).

Please refer to FIG. 1. FIG. 1 is schematic diagram of a traditional OLED TFT structure. In the prior art, a glass substructure 102 is provided, with an insulator layer 104 and amorphous silicon film (not shown) deposited on the glass substructure 102. The amorphous silicon film then re-crystallizes to polycrystalline silicon after an excimer laser annealing (ELA) process. Then, an active layer 106 pattern is etched on the polycrystalline silicon, and a gate insulator layer 108 is deposited on the active layer 106 and the insulator layer 104.

Moreover, a gate metal 110 is etched by a metal etching process, a second mask, and a second PEP. The gate metal 100 is a self-alignment mask and the boron ion doping process proceeds on the active layer 106, forming a source 103 and a drain 105 on the corresponding sides of the gate metal 110. In the prior art, a capacitance (Cst) 113 is formed on a poly silicon lower panel 107, the gate insulator layer 108 and a metal upper panel 111 by the above-mentioned first PEP and the second PEP individually. Then, an inter-layer dielectric (ILD) 112 is deposited on the glass substructure 102 to cover the gate metal 110, the metal upper panel 111, and the gate insulator layer 108. The particle ILD and the gate insulator layer 108 of the source 103 and the drain 105 are then removed by a third photo-mask and a third PEP to define a corresponding via hole 115. Furthermore, a metal forming process is performed utilizing a fourth photo-mask, and the fourth mask etches a data line and a drain metal on the via hole 115 of metal layer 114 for electrically contacting the source 103 and the drain 105. A flat passivation layer 116 is forming on the metal layer 114 and the ILD 112 using a fifth photo-mask and a fifth PEP, and the passivation layer 116 on the metal layer 114 which electrically contacts the drain 105 is removed. An ITO transparent electrode film (not shown) is formed on the passivation layer 116, and a sixth photo-mask and a sixth PEP are used to define a suitable shape for the transparent electrode 118. Then, a pixel define layer (PDL) 120 is doped and is etched by a seven photo-mask and a seven PEP. Finally, a LED (not shown) is formed on the transparent electrode 118 to complete the traditional OLED panel 100.

In the prior art, seven photo-masks are needed to complete the above-mentioned OLED. The process is complex and the use of too many masks increases the cost and increases the misalignment, thereby decreasing the yield. That is why decreasing the number of the photo-masks is an important issue in the monitor manufacturing industry.

SUMMARY OF THE INVENTION

The present invention relates to a method of manufacturing an AMOLED to solve the above-mentioned problems.

The present invention provides an embodiment relating to a method of manufacturing an AMOLED panel. The method comprises providing a substrate, forming a TFT on the substrate, forming an inter-layer insulator layer, forming a plurality of via holes, forming a metal layer which electrically contacts a source and a drain, and forming a transparent electrode, a pixel define layer and a LED.

The present invention omits the passivation layer, dopes the transparent electrode on the metal layer and the ILD, and needs only six photo-masks. If the metal layer and the transparent electrode are made by the same PEP, the present invention only needs five photo-masks. Therefore, the present invention could decrease costs and simplify the manufacturing process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
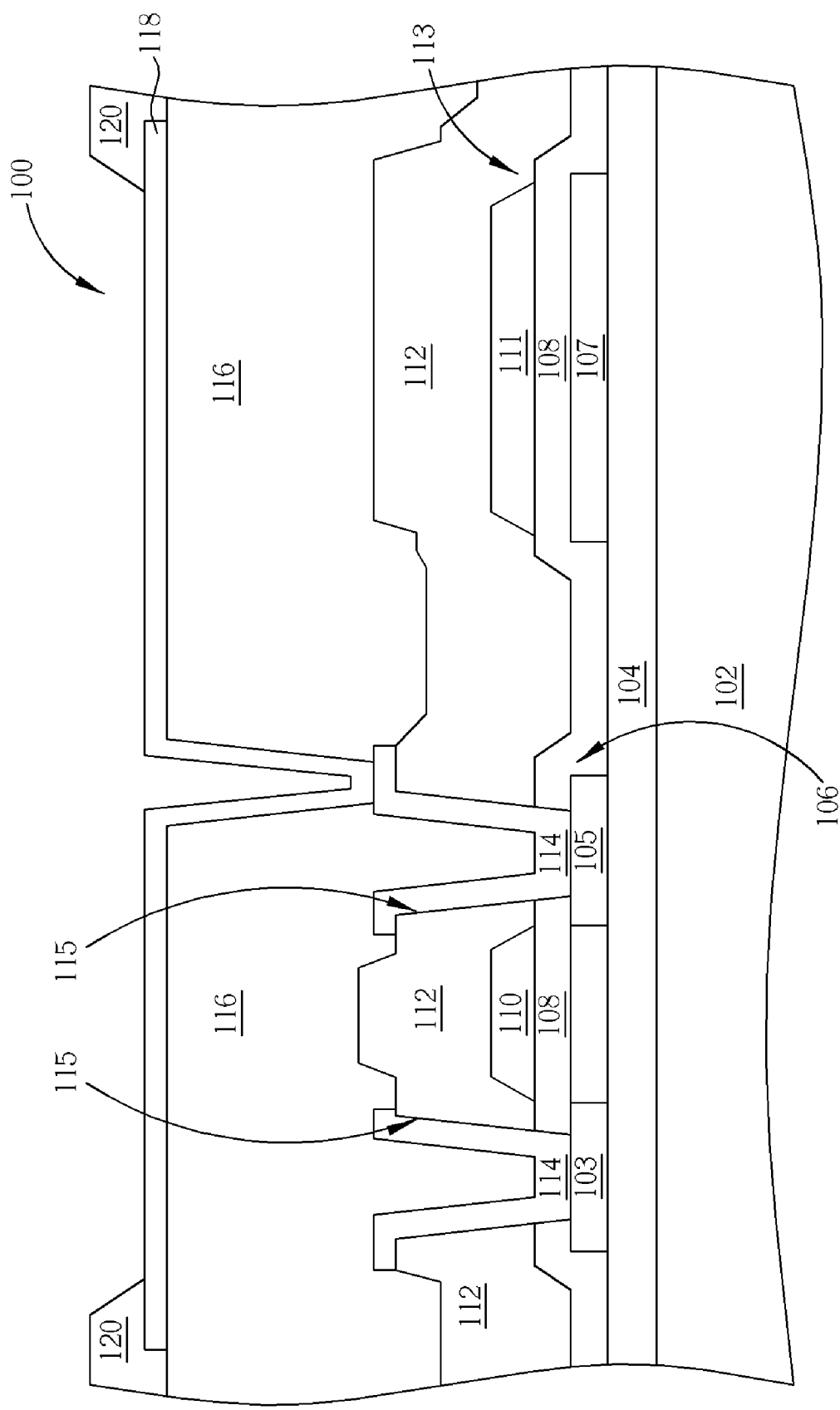
FIG. 1 is schematic diagram of a traditional OLED TFT structure.
Figure 2:
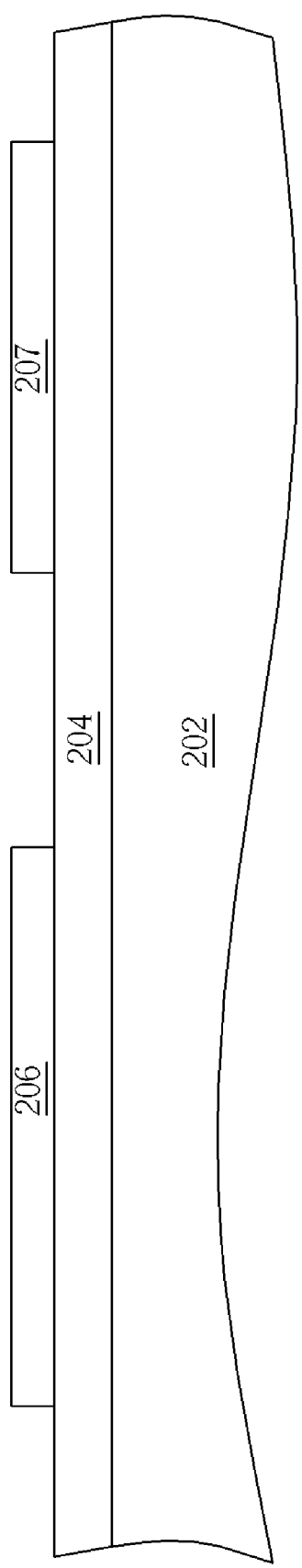
FIGS. 2 to 6 are schematic diagrams of manufacturing an AMOLED according to the present invention.

Please refer to FIGS. 2 to 6. FIGS. 2 to 6 are schematic diagrams of manufacturing an AMOLED according to the present invention. Firstly, FIG. 2 illustrates providing a glass substructure 202 as a lower base, forming a buffer insulator layer 204 and an amorphous silicon film (not shown) on the glass substructure 202, shooting lasers and annealing, such that the amorphous silicon film (not shown) becomes a polycrystalline silicon film. A desired pattern is then etched on an active layer 206 utilizing a first photo-mask and a first PEP, wherein each pixel area forms a poly silicon lower panel 207 as a result of the first PEP.

Figure 3:
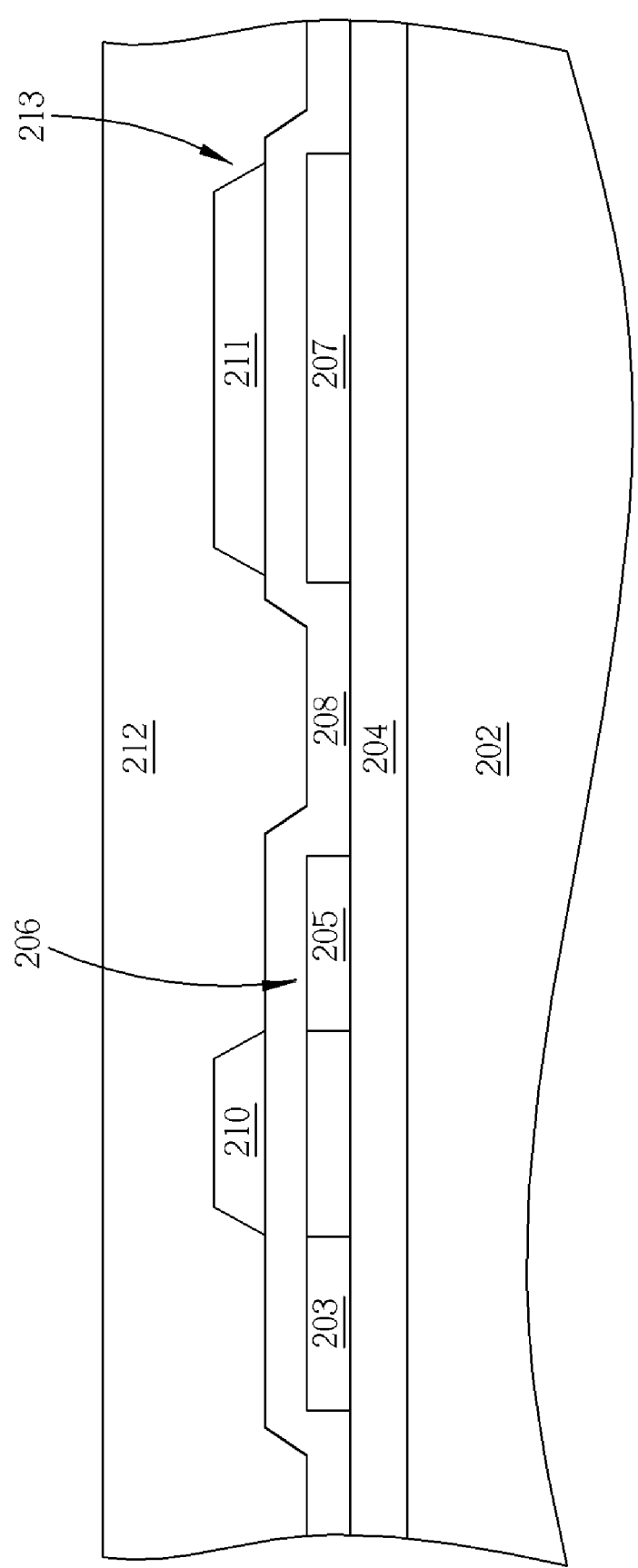

Please refer to FIG. 3, a gate insulator layer 208 deposited on the active layer 206 and the buffer insulator layer 204. Then, a first metal film (not shown) is deposited on the gate insulator layer 208 using a second photo-mask and a second PEP forms patterns of a scan line (not shown), a gate metal 210, and a metal upper panel 211. A capacitance (Cst) 213 forms from the poly silicon lower panel 207, the gate insulator layer 208 and the metal upper panel 211. After that, the gate metal 210 is used as a self-alignment mask for performing a boron ion doping process, and the result forms a source 203 and drain 205 on the corresponding sides of the gate metal 210. Moreover, a silica or sensitization material is smeared on the gate metal 210, the metal upper panel 211, and the gate insulator layer 208 through a spin on glass (SOG) process, which forms a flat inter-layer dielectric (ILD) 212. Because of the SOG process, a drive array of the lower base has a better flat effect and the organic material ladder cover is better, too.

Figure 4:
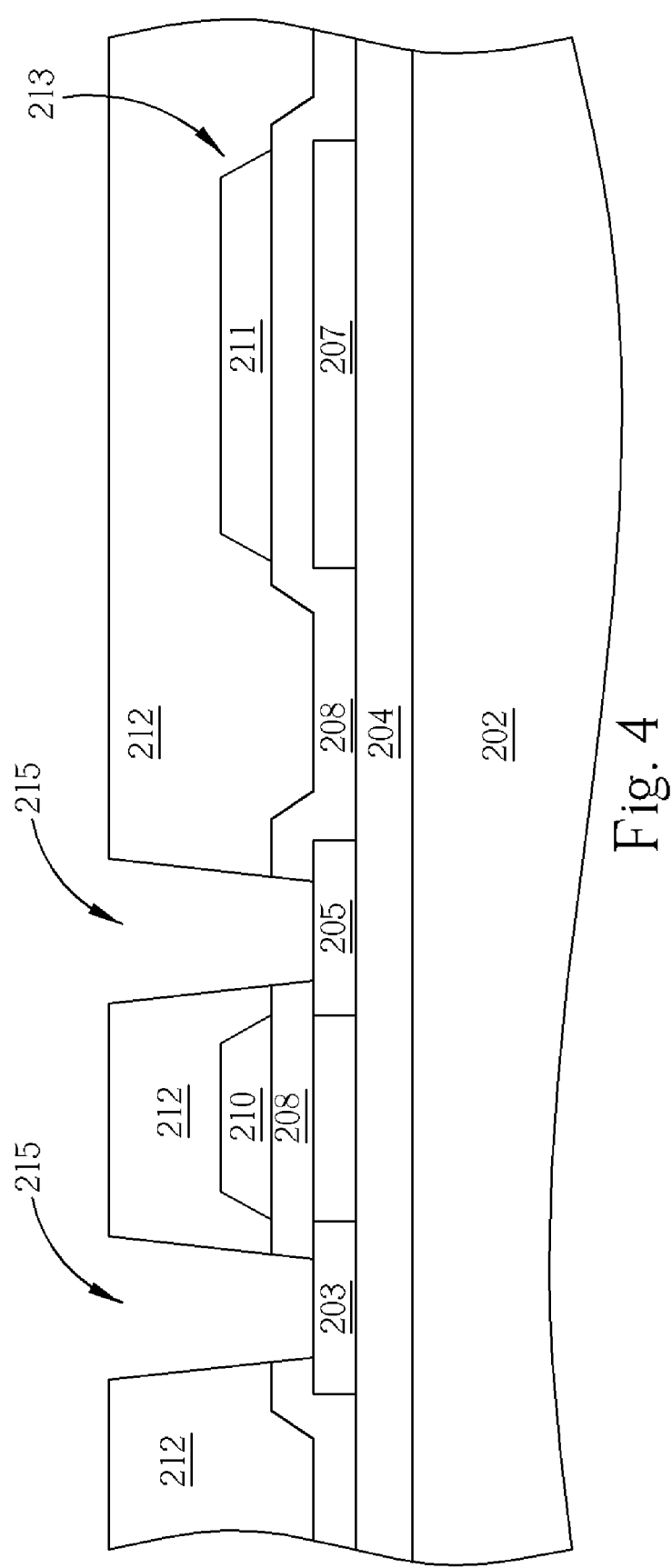
Figure 5:
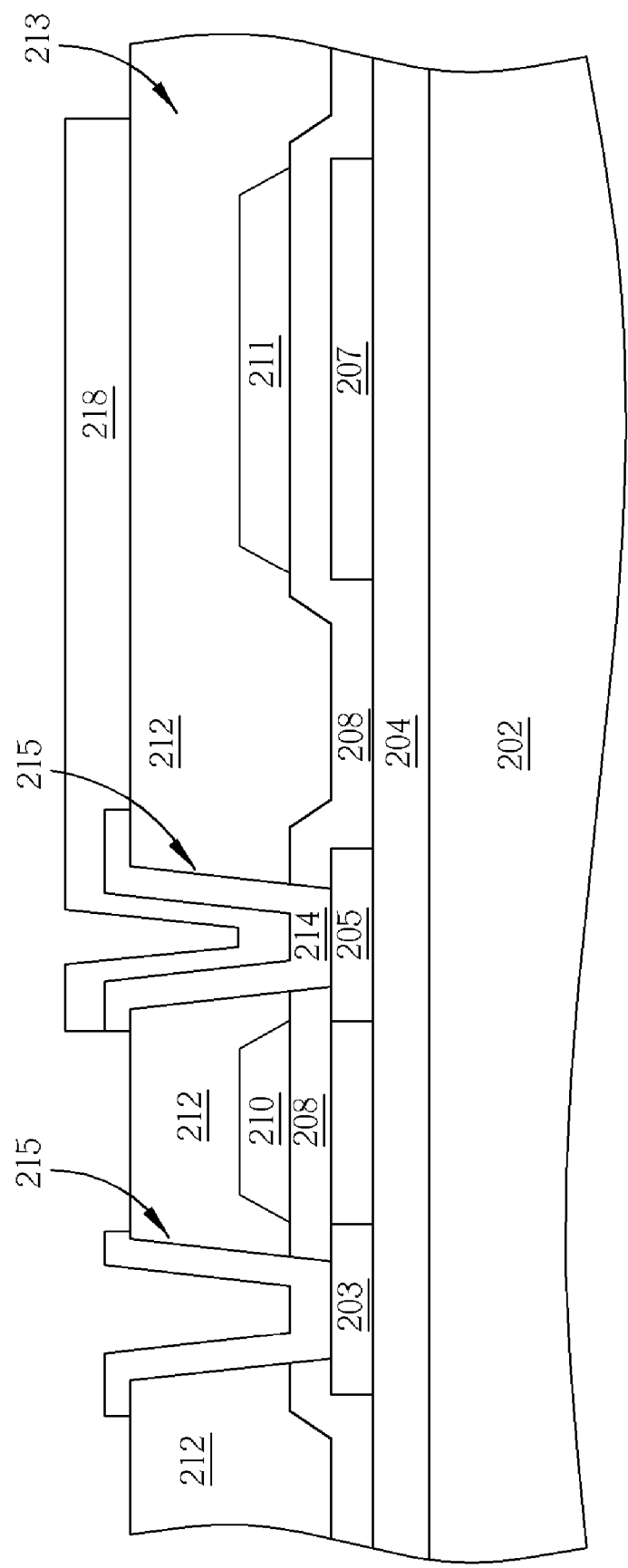

Please refer to FIG. 4, which illustrates removing partial of the ILD 212 and the gate insulator layer 208 on the source 203 and drain 205 using a third photo-mask and a third PEP. Please refer FIG. 5, which illustrates performing a second metal film etching process using a fourth photo-mask and a fourth PEP to etch a data line and a metal layer 214 on a via hole 215 surface, where the data line and the metal layer 214 electrically contact the source 203 and the drain 205 individually. Then, ITO or IZO is formed as a transparent electrode layer (not shown) on the metal layer 214 and the ILD 212, using a fifth photo-mask and a fifth PEP for defining a suitably shaped transparent electrode 218.

Figure 6:
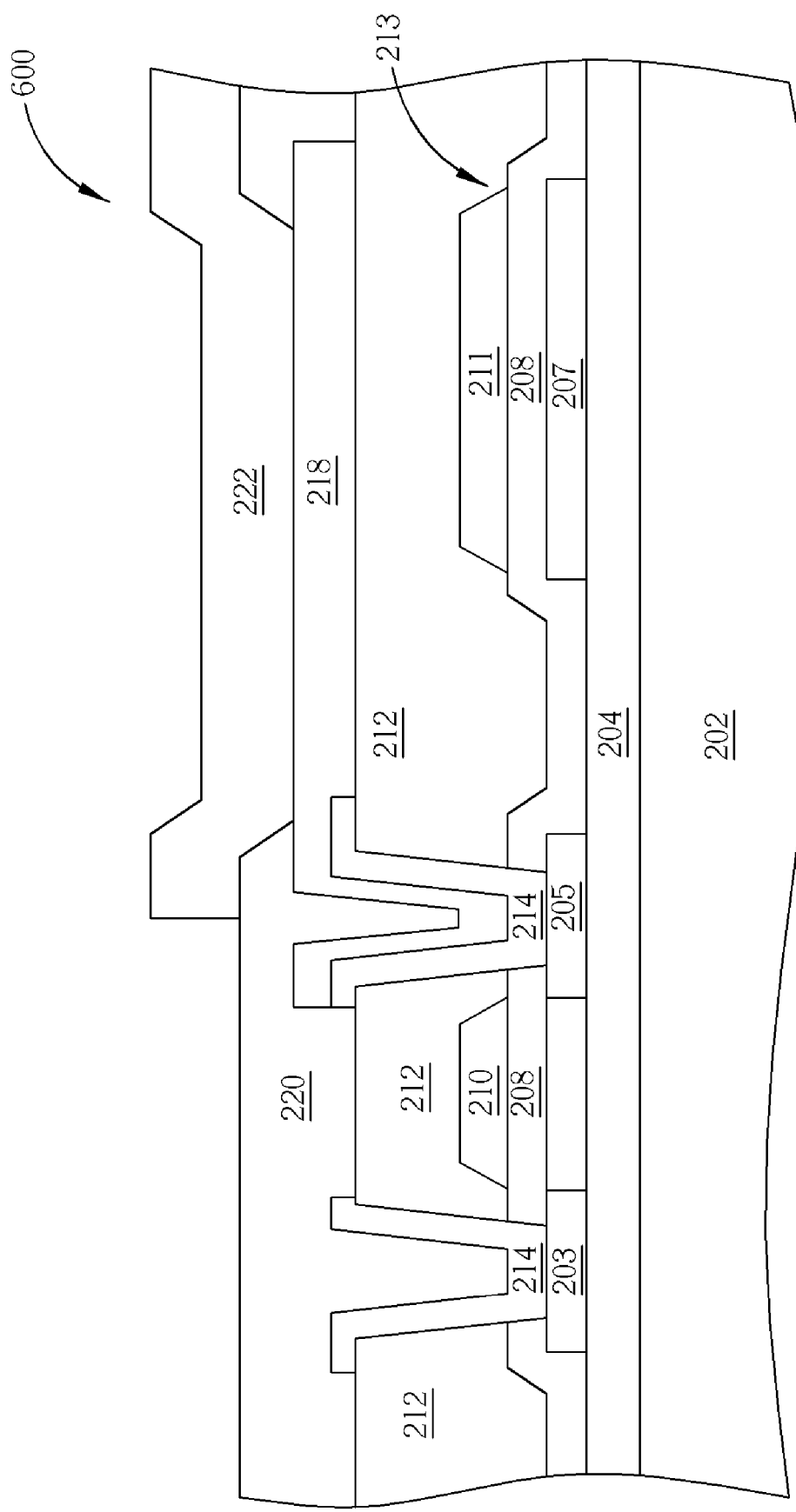

Please refer to FIG. 6, which illustrates spinning on glass (SOG) by silica smearing a pixel define layer (PDL) 220 on the metal layer 214, the transparent electrode 218 and the ILD 212, using a sixth photo-mask and a sixth PEP to form a suitably shaped pixel define layer 220. Finally, an organic light emitting diode (OLED) is formed on the transparent electrode 218 to complete the OLED panel 600. Of note, if the transparent electrode 218 cover of this embodiment is wider than the metal layer 214 which electrically contacts the drain 205, the light of the OLED 222 emits up and down to be a bottom emission LED panel or a top and bottom emission OLED.

Figure 7:
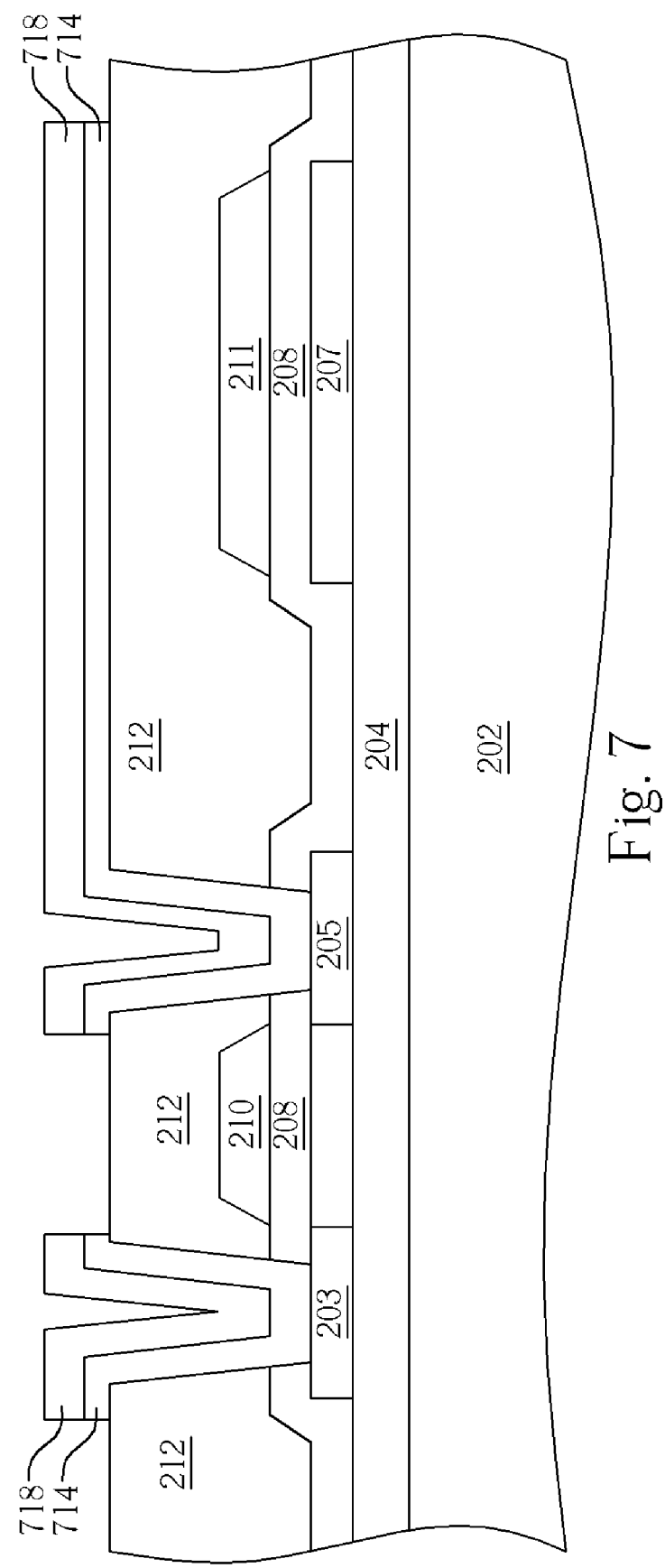
FIG. 7 is schematic diagram of forming the transparent electrode and metal layer using the same photo-mask according to the second embodiment.

Otherwise, please refer to FIG. 7. FIG. 7 is a schematic diagram of forming the transparent electrode and metal layer using the same photo-mask according to the second embodiment. The difference between the second embodiment and the above-mentioned embodiment is the use of the same fourth photo-mask and fourth PEP after forming a metal layer 714 and a transparent electrode 718 to etch the data line and the same pattern of the metal layer 714 and the transparent electrode 718. In addition, the metal layer 714 and the transparent electrode 718 electrically contact the source 203 and the drain 205. Because of the transparent electrode 718 and the metal layer 714 having the same shape and the metal layer having a reflective effect, the metal layer 714 reflects the LED light to form a top emission LED panel. Finally, the pixel define layer and LED are formed in the same way as mentioned above. Thus, the second embodiment only needs five masks.

Compared to the prior art, the present invention omits the passivation layer, dopes the transparent electrode on the metal layer and the ILD, and needs only six photo-masks. If the metal layer and the transparent electrode are made by the same PEP, the present invention only needs five photo-masks. Since the number of the photo-mask is less than the prior art, the present invention is able to decrease manufacturing costs and simplify the manufacturing process. In addition, the present invention can be applied in a low temperature polycrystalline silicon TFT (LTPS TFT) array LCD panel manufacturing process. This not only simplifies the photo-mask, but also forms the reflecting, penetrating or half-reflecting-half-penetrating LCD using different corresponding positions of the metal layer and the transparent electrode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing an active matrix organic light-emitting diode, the method comprising:
    providing a substructure;
    forming at least a TFT on the substructure;
    forming an inter-layer dielectric on the TFT and the substructure;
    forming a plurality of via holes on the ILD, each via hole reaching a source and a drain of the TFT;
    forming a metal layer on each via hole, the metal layer electrically contacting the source and the drain;
    after forming the metal layer, forming a transparent electrode on the metal layer surface electrically contacting the drain;
    forming a pixel define layer on the transparent electrode and the ILD; and
    after forming the transparent electrode, forming a light-emitting diode on the transparent electrode.

2. The method of claim 1, wherein the substructure comprises one of a transparent glass substructure, a flexible plastic substrate, and metal foil.

3. The method of claim 1, wherein the TFT is a low temperature polycrystalline silicon TFT and the method of forming the LTPS TFT comprises:
    forming a buffer insulator layer on the substructure;
    forming an active layer on the buffer insulator layer surface;
    forming a gate insulator layer on the active layer and the buffer insulator layer;
    forming a gate metal on the gate insulator layer, the gate metal being formed on a central portion of the active layer; and
    performing a self aligned procedure with the gate metal to perform ion doping on the active layer and to form the source and the drain on the corresponding sides of the gate metal.

4. The method of claim 3, wherein the method of forming the active layer further comprises:
    forming an amorphous silicon film on the buffer insulator layer;
    re-crystallizing the amorphous silicon film to form a poly-crystal silicon; and
    performing a first photolithograph process on the poly-crystalline silicon to form the active layer.

5. The method of claim 3, wherein the method of forming the gate metal further comprises:
    forming a first metal film on the gate insulator layer; and
    performing a second PEP on the first metal film to form the gate metal.

6. The method of claim 1, wherein the via hole of the ILD is formed by a third PEP.

7. The method of claim 1, wherein the ILD is formed by a spin silica on glass process.

8. The method of claim 1, wherein the ILD is sensitization material.

9. The method of claim 1, wherein the method of forming the metal layer further comprises:
    forming a second metal film on the ILD; and
    performing a fourth PEP on the second metal film to form the metal layer electrically contacting the source and the drain.

10. The method of claim 9, wherein the method of forming the transparent electrode and the pixel define layer further comprises:
    forming a transparent electrode film on the ILD and the metal layer;
    performing a fifth PEP on the transparent electrode to form the transparent electrode; and
    forming the pixel define layer by a etching process and a sixth PEP.

11. The method of claim 10, wherein the transparent electrode cover is wider than the metal layer electrically contacting the drain, and the AMOLED is a bottom emission LED panel and an upper and lower emission organic light-emitting diode.

12. The method of claim 10, wherein the pixel define layer is formed by a spin silica on glass process.

13. A method of manufacturing an active matrix organic light-emitting diode, the method comprising:
   providing a substructure;
   forming at least a TFT on the substructure;
   forming an inter-layer dielectric on the TFT and the substructure;
   forming a plurality of via holes on ILD, each via hole reaching a source and a drain of the TFT;
   forming a metal layer and a transparent electrode layer on each via hole, the metal layer and the transparent is electrode layer having the same pattern and electrically contacting the source and the drain individually;
   forming a pixel define layer on the transparent electrode layer and the ILD; and
   after forming the transparent electrode, forming a light-emitting diode on the transparent electrode layer.

14. The method of claim 13, wherein the TFT is a low temperature polycrystailine silicon TFT and the method of forming the LTPS TFT comprises:
   forming a buffer insulator layer on the substructure;
   forming an active layer on the buffer insulator layer surface;
   forming a gate insulator layer on the active layer and the buffer insulator layer;
   forming a gate metal on the gate insulator layer, the gate metal being formed on a central portion of the active layer; and
   performing a self aligned procedure with the gate metal to perform ion doping on the active layer and to form the source and the drain on the corresponding sides of the gate metal.

15. The method of claim 14, wherein the method of forming the active layer further comprises:
   forming an amorphous silicon film on the buffer insulator layer;
   re-crystallizing the amorphous silicon film to form a poly-crystal silicon; and
   performing a first photolithograph process on the poly-crystalline silicon to form the active layer.

16. The method of claim 14, wherein the method of forming the gate metal further comprises:
   forming a first metal film on the gate insulator layer; and
   performing a second PEP on the first metal film to form the gate metal.

17. The method of claim 13, wherein the via hole of the ILD is formed by a third PEP.

18. The method of claim 13, wherein the ILD is formed by a spin silica on glass process.

19. The method of claim 13, wherein the ILD is sensitization material.

20. The method of claim 13, wherein the method of forming the same pattern of the metal layer and the transparent electrode layer further comprises:
   forming a second metal film and a transparent electrode film on the ILD; and
   performing a fourth PEP on the second metal film.

21. The method of claim 20, wherein the pixel define layer is formed by an etching process and a fifth PEP.

22. The method of claim 21, wherein the pixel define layer is formed by a spin silica on glass process.

23. The method of claim 22, wherein the AMOLED is a top emission LED panel.

* * * * *